United States Patent [19]
Lanton

[11] 4,119,959
[45] Oct. 10, 1978

[54] MULTI-BIT FUNCTION GENERATOR

[75] Inventor: Seymour Lanton, Plainview, N.Y.

[73] Assignee: ILC Data Device Corporation, Bohemia, N.Y.

[21] Appl. No.: 723,111

[22] Filed: Sep. 14, 1976

[51] Int. Cl.$^2$ ............................................. H03K 13/00
[52] U.S. Cl. ........................ 340/347 SY; 340/347 DA
[58] Field of Search ................. 340/347 SY, 347 DA, 340/347 M; 235/197, 150.53; 328/14

[56] References Cited
U.S. PATENT DOCUMENTS

| 3,264,637 | 8/1966 | Parkinson | 340/347 DA |
| 3,509,556 | 4/1970 | Schmidt | 340/347 DA |
| 3,696,407 | 10/1972 | Egerton | 340/347 SY |

Primary Examiner—Charles D. Miller
Attorney, Agent, or Firm—Lerner, David, Littenberg & Samuel

[57] ABSTRACT

A function generator for use in a synchro to digital (S to D) converter in which successive approximations of the digital output are made by switching between two chains of cascade connected operational amplifiers so that, as one chain is incremented to decrease the error signal appearing at the output of the chain, the other chain is coupled to control the error reduction operation until the aforementioned switching is completed, at which time the chains reverse roles.

13 Claims, 8 Drawing Figures

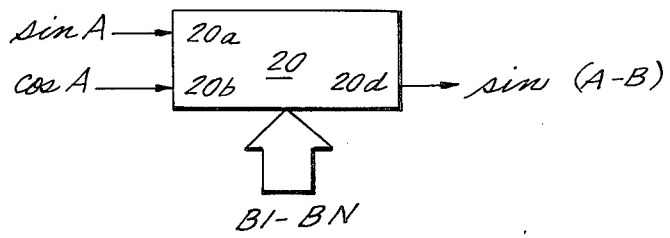
FIG. 4. (S to D)
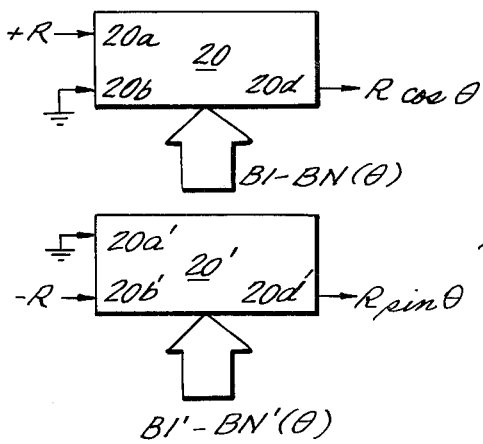
FIG. 5. (D to R)
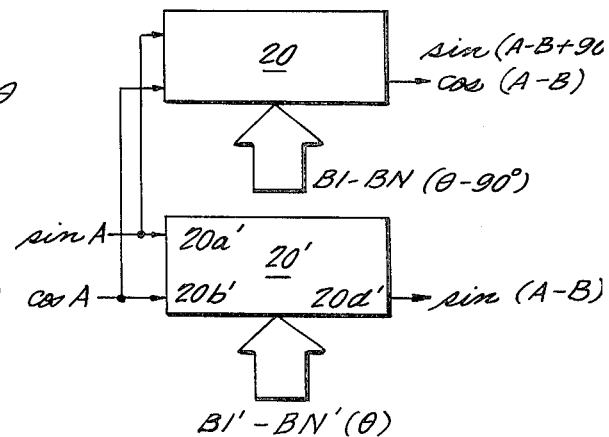
FIG. 6. (COMPUTING RESOLVER)
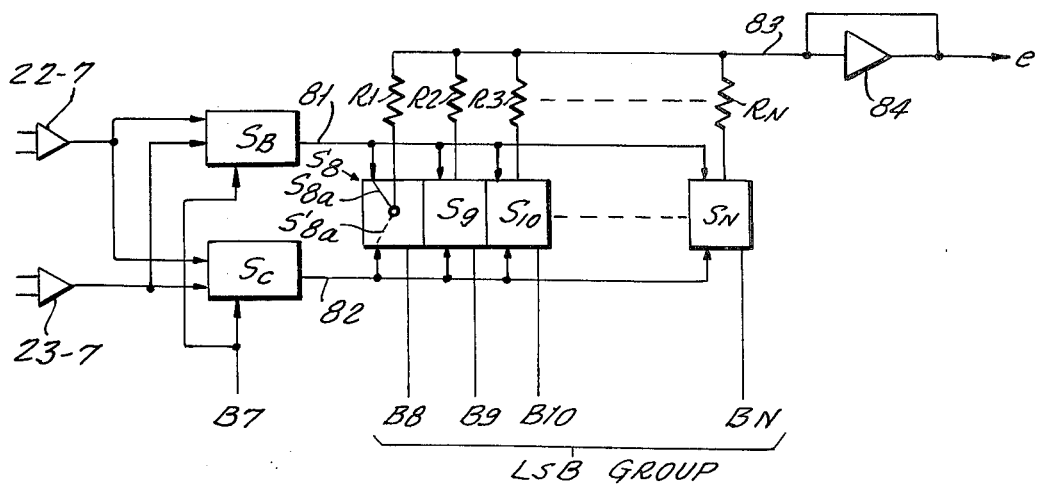
FIG. 7.

MULTI-BIT FUNCTION GENERATOR

BACKGROUND OF THE INVENTION

The present invention relates to function generators and more particularly to a solid state converter design using two cascaded amplifier chains and means for cross-connecting at selected points along the chains to generate the desired output signal to a very high degree of accuracy.

In the prior art when it was desired to provide a function generator having very high precision, a resistance approach or an autotransformer approach was utilized. In the former, a potentiometer having a plurality of taps is coupled to an output through a multiplexing switching network, a reference signal being applied across the end terminals. In the latter the transformer winding, or, in the case of a transformer having a primary and a secondary — the secondary winding, has a plurality of taps respectively coupled to a output line through a multiplexing switching network. High accuracy would necessarily require a large number of such taps. For example, a 14 stage frequency generator would require a $2^{14}$ taps! This leads to a highly impractical design.

BRIEF DESCRIPTION OF THE INVENTION

The present invention provides all solid-state circuitry for yielding the desired accuracy while providing a highly simplified and, hence, reliable design as compared with present day designs.

The present invention is comprised of first and second chains of cascaded operational amplifiers, one chain of unity gain amplifiers and the other chain having amplifiers whose gain proportionally changes from one adjacent stage to the next. By cross-connecting the chains at appropriate stages either one of the chains may be utilized to generate an output which is a function of control and/or reference input information and which generates the output so that it deviates from the true waveshape by an amount which is significantly smaller than any prior art device being used to generate the same function. The circuitry is useful in D to S and S to D converters and computing resolvers, for example.

BRIEF DESCRIPTION OF THE FIGURES AND OBJECTS

One object of the present invention is to provide a solid state function generator yielding high accuracy through the employment of first and second cascaded amplifier chains and a switching means for selectively interconnecting two chains at any desired stage therealong to thereby creating the output with great accuracy.

Another object is to provide a generator of the type described above wherein amplifier gains in said first and second chains respectively vary proportionally along one chain and are constant and uniform along the other chain to thereby simulate the desired function at the output of at least one of said chains.

Another object of the invention is to provide a generator of the type described in which warping resistors are employed in said function generator at piece-wise linear segments of the function being generated in which said segments are smaller than heretofore employed in conventional function generators.

The above as well as other objects will become obvious upon consideration of the accompanying detailed description and drawings in which:

FIGS. 4, 5 and 6 are simplified block diagrams showing applications of the function generator of the present invention; and FIG. 7 is a block diagram showing a function generator circuit of multiplexed design and which may be used with the circuitry of FIG. 2 to create a multi-stage function generator of having a degree of accuracy not heretofore attainable using prior art techniques.

DETAILED DESCRIPTION OF THE INVENTION

Figure 1:
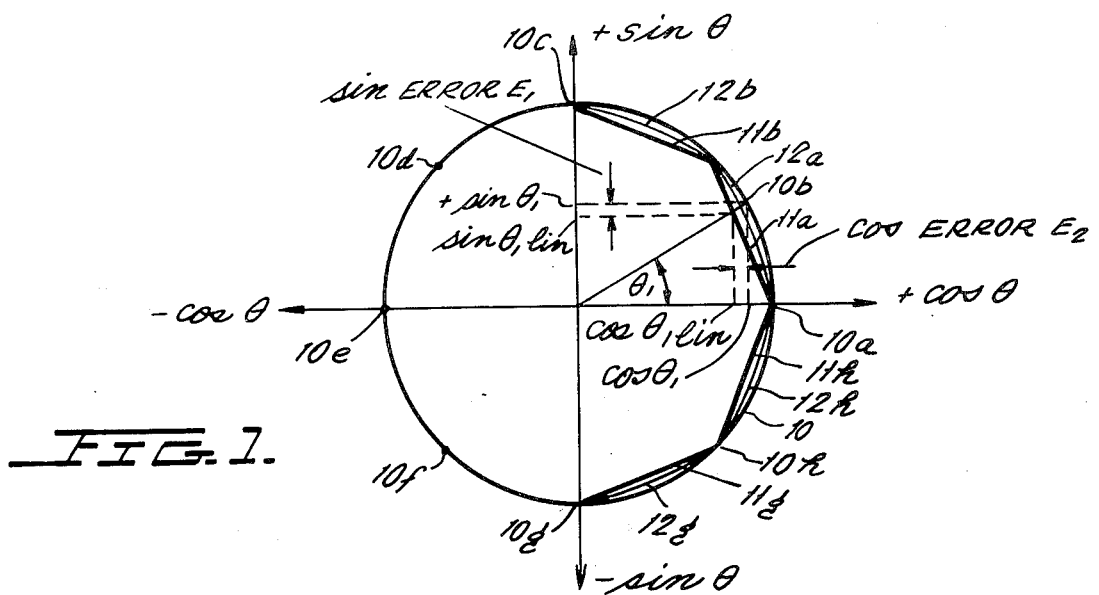
FIGS. 1 and 2a are plots useful in describing the advantages of the present invention.

FIG. I shows a circle 10 which represents the relationship of sin $\theta$ and/or cos $\theta$ to any angle $\theta$. For example, for angle $\theta$, the cos function is cos $\theta$, while the sine function is sin $\theta$, said values being respectively plotted along the "X" and "Y" axes.

In order to generate cos $\theta$ and sin $\theta$ electrically, the circle may be divided into octants wherein linear representations of each arc of the circle may be represented by linear segments i.e. the segments 11a, 11b, . . ., 11g and 11h. For the angle $\theta$, the values obtained are cos $\theta$, and sin $\theta$, where E1 & E2 represent the error (i.e. deviation from actual value) due to use of the linear method. The end points i.e. end points 10a and 10b, of each linear segment i.e. segment 11a, can be seen to be error free (i.e. minimum error) while maximum error occurs between end points.

By using "warping" resistors (to be more fully described) in the function generators it is possible to modify the linear representation into a non-linear representation (segment 12a, for example) which more closely resembles the actual curve (arc of circle 10 between 10a and 10b), thus greatly reducing the maximum error.

The combination of the use of smaller and smaller linear segments coupled with the use of appropriate warping resistors provides a function generator which is thus capable of yielding an almost negligible error.

Figure 3:
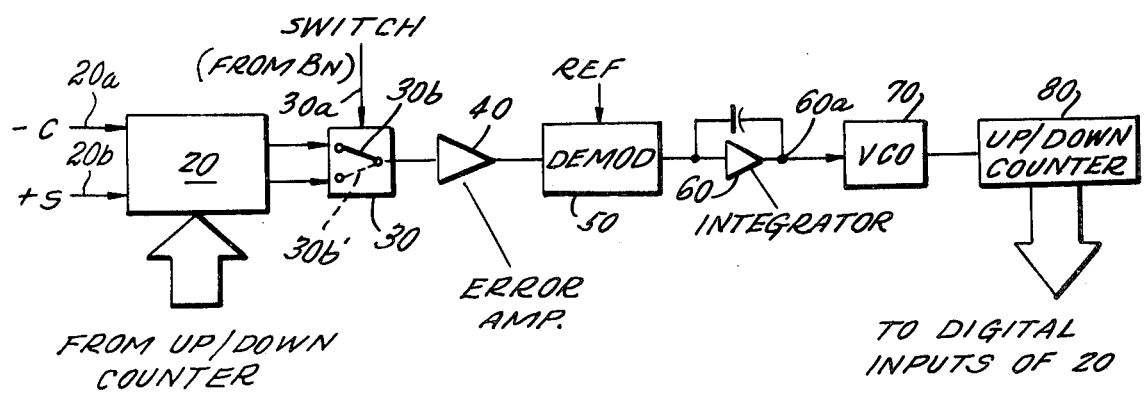
FIG. 3 shows a block diagram showing an S to D converter system embodying the circuitry of FIG. 2.

The implementation of the invention as manifested in an S to D (synchro to digital) converter is shown in FIG. 3 which converter may also be considered in alternative form as an S to R (synchro to resolver) converter which then utilizes an R to D converter to obtain the desired digital output. FIG. 3 thus shows an R to D converter, it being understood that conventional techniques may be employed to develop the S to R conversion.

Figure 2A:
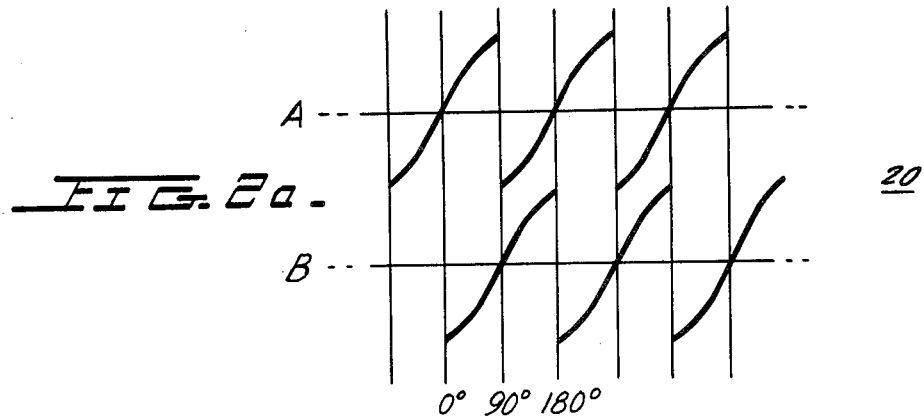

As shown in FIG. 3, the function generator 20 comprises input terminals 20a and 20b receiving the signals —C and +S which are respectively represented by the waveforms A and B of FIG. 2a. Between 0° and 90° waveform A represents sin $\theta$ while waveform B represents cos $\theta$. Thus by inverting waveform B between 0° and 90° the result is cos $\theta$. (where 0° $\leq \theta \leq$ 90°).

For example considering the cos $\theta$, and sin $\theta$, of FIG. 1 as inputs and assuming it is desired to derive the digital binary word for the angle $\theta_1$ it can be seen that $\theta_1$ can be derived from the linear segment 11a extending between end points 10a and 10b. The error signal output coupled to switch 30 (under control of the digital input to the Nth or least significant bit position of the digital word being generated) is amplified at 40 to generate an output V where V=sin (A−B) (or V=cos (A−B). This output is demodulated at 50 and undergoes integration at 60 to develop an output level $V_1$, where $V_1$ = A−B. The level at output 60a drives voltage controlled oscillator (VCO) 70 which developes pulses at a rate which is a function of the voltage $V_1$. The pulses respectively increment or decrement counter 80 to develop a binary output which is coupled to selected inputs of the logical gating circuits 21-1 through 21-N for controlling the current path followed by the input analog signals in the generation of the error signals. The logical gates control the operation of switches $S_A$ and $S_1$-$S_n$ which operate as single pole double-throw switches, coupling only one of their inputs to their respective output.

Each binary bit representa a particular discrete point along circle 10 (FIG. 1). For example when the digital word is zero, i.e. all bits 1-N are binary zero, all of the inputs to gates 21-1 through 21-N are low and the outputs are low. Thus all switches $S_A$ and $S_1$-$S_n$ have their inputs $S_Ab$ and $S_1b$-$S_nb$ connected to their outputs $S_Ac$ and $S_1c$-$S_nc$. Thus operational amplifier 22-1 and 23-1 simply invert their inputs.

Since the angle θ, is greater than 0° but less than 90°, the most significant bit B1 will be zero ($\theta$ < 180°) and B2 will be zero ($\theta$ < 90°). Thus the output at 22-1a is +C since operational amplifier 22-1 simply inverts the signal at its inverted input (the non-inverted input being grounded through switch $S_A$). The output at 23-1a will likewise be −S (i.e. +S inverted). The output at 22-1 represents the angle θ − 90° while the output 23-1 represents the angle θ, i.e. θ lies between the end points of a linear segment between 10a and 10c of FIG. 1. Since θ is less than 45° (see FIG. 1) the bit B3 is zero and the values $R_1$-2 and $R_2$-2 are chosen to generate an output at 22-2a which is a linear representation of a straight line segment between points 10a and 10b. In a similar fashion the values $R_1$-4 and $R_2$-4 are chosen to be a linear representative of the line segment between points on the circuit lying at 0° and 22.5°. The resistor combinations $R_1$-5 through $R_1$-N and $R_2$-5 through $R_2$-N are chosen in a similar fashion so that the general form for any stage yields a linear representation given by $\theta$ − 360°/2n where n = 1, 2, ..., N and represents the bit position of the binary word, the higher the value of n, the lower the significance of the bit ("N" being the least significant bit LSB and "1" being the most significant bit MSB).

In each case all of the operational amplifiers 23-2 through 23-N generate signals of unity gain, while the amplifiers 22-1 through 22-N generate signals of less than unity gain.

Assuming maximum error signal, i.e. the contents of counter 80 is zero then the output at 22-N is sin θ−(m+1) φ while the output at 23-N is sin (θ−m φ) since n=0 then the maximum error (θ−0°) appears at 23-N and differs from the error signal sin θ−(0+1)φ or sin (θ−φ) appearing at 22-N, by the amount of the least significant bit, which value is dependent upon the total number of stages N employed in the function generator. The maximum error is thus taken from 23-N and coupled to amplifier 40 (FIG. 3) through switch 30 whose control input is coupled to the LSB position and hence has its switch arm in the dotted position 30b'.

When the first pulse is accumulated in counter 80 the count now shows a binary ONE in the least significant bit position. This changes BN to binary ONE, causing exclusive — OR switch 21-N to switch, coupling the output from amplifier 22-(N-1) to the non-inverting input of amplifier 23-N making the output at 23-N sin (θ−φ) which is now equal to the output at 22-N. The ONE level of bit BN also switches the arm of switch 30 from 30b' to position 30b so that the largest error signal is still coupled to error amplifier 40 (outputs at 22-N and 23-N being equal).

The next pulse from VCO 70 increments the counter so that BN is zero and B(N-1) is ONE. Exclusive-OR gate 21-N causes switch SN to disconnect amplifier 22-(N-1) from 23-N while exclusive-OR gate 21-(N-1) connects amplifier 22-(N-1) to the input of amplifier 23-(N-1). Thus the current increment at stage 22-N is the sum of the output at amplifier 22-(N-1) and 22-(N-2) while the output of amplifier 23-N is the current magnitude appearing at the output of 22-(N-2). Thus the error signal at 22-N is sin (A−3φ) while the error signal at 23-N is sin (θ−2φ). The larger error signal is again at the output of 23-N, switch arm 30b switches to 30b' and the larger error signal is again coupled to VCO 70.

It should be noted that at every other increment to counter 80, the switch SN reverses so that the output at 23-N pulls up to the output at 22-N before the next increment to the counter so that whenever the output of a more significant amplifier is switched in to one of the chain of amplifiers, the VCO is always coupled to the output of the opposite cascade chain of amplifiers to prevent the occurrence of a "glitch" in the output.

Figure 2:
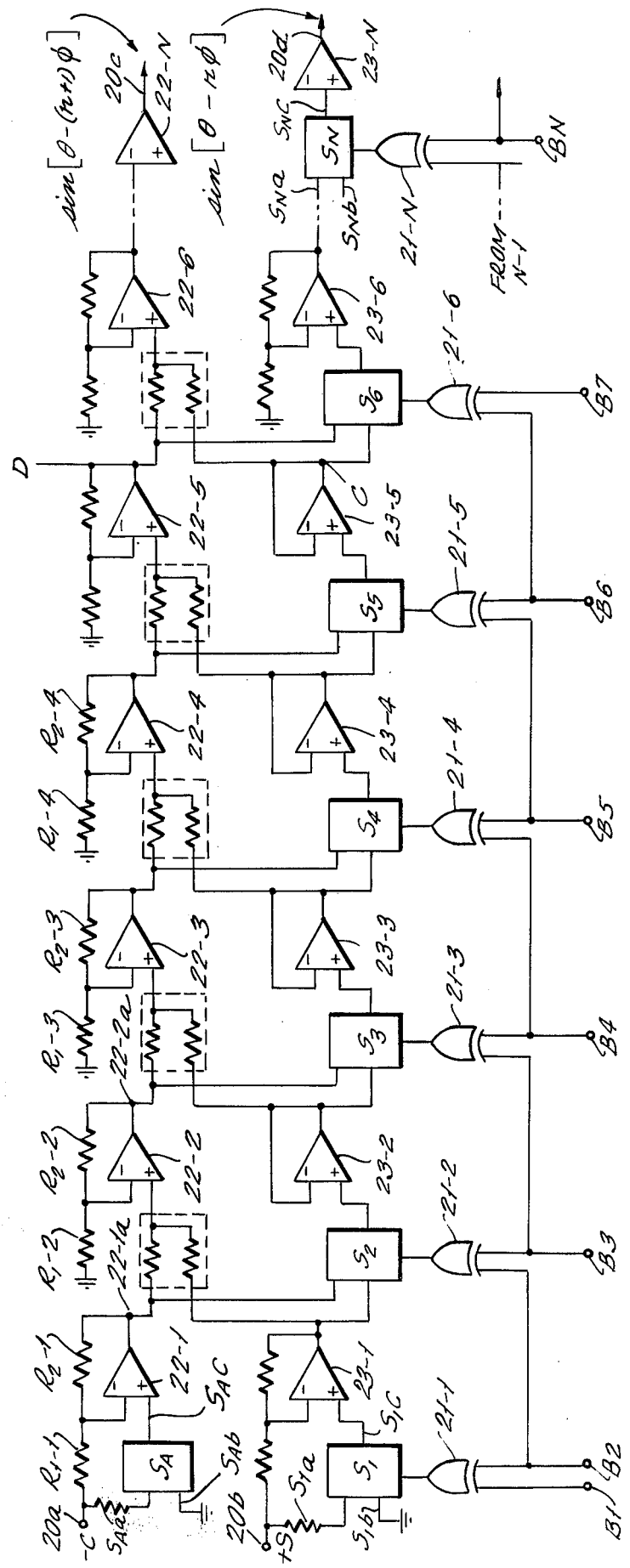
FIG. 2 is a circuit diagram of a function generator embodying the priniciples of the present invention.

FIG. 4 shows the basic building block of the function generator of FIG. 2 for use in an S to D converter.

The technique employed in FIG. 2 may be utilized in a digital to resolver converter as shown in FIG. 5 wherein circuits 20 and 20¹ (similar to circuit block 20 of FIG. 4) have their inputs 20a, 20b and 20a¹, 20b¹ connected to a reference signal R and ground in the manner shown. Applying a digital binary word representative of θ to inputs B1-BN and B1¹-BN¹ the outputs 20d and 20d¹ (see also FIG. 2) represent R cos θ and R sin θ respectively. Since the outputs 20c and 20d differ from one another by almost two LSB's it is possible to select the outputs 20c and 20c¹, if desired. The reference carrier R can be removed by conventional demodulation techniques when desired.

The function generator may be employed in a computing resolver as shown in FIG. 6 wherein the analog inputs (sin A, cos A) are applied to 20a, 20b and 20a¹, 20b¹, as shown. The control inputs B1-BN and B1¹-BN¹ receive a binary word representing an angle B. Outputs 20d and 20d¹ respectively generate analog outputs in the form of a different signal representing the difference between A and B wherein 20d generates cos (A−B) and 20d¹ generates sin (A−B).

The group of least significant bits can be implemented by a linear weighted binary ladder network and associated switches without any sacrifice in accuracy. For example the circuitry 20 of FIG. 2 may incorporate six stages as shown and the remaining stages may take the form of a weighted binary ladder network as shown in FIG. 7. The switches SB and SC selectively couple one of the amplifiers 22-7 or 23-7 to one array of inputs for switches S8-SN, and the other amplifier to the remaining array. The branch resistors are selectively connected to one of the two common lines 81 or 82 dependent upon the binary states of the group of LSB bits B8-BN controlling the switch arms (S8a, for example) of the switches S8 to SN. The signal in common line 83 is amplified at 84 to create the error signal *e* which is of the form $e = \sin(A - B)$.

The "warping" resistors utilized to non-linearize the sine and cosine curves are in the form of the inherent resistances of the switches SB and SC. Alternatively the warping resistances may be in form of discrete resistance elements positioned between the outputs of switches SB and SC and the left-hand ends of common input lines 81 and 82. The cross coupling of the outputs of amplifiers 22-7 and 23-7 through switches SB and SC is provided to eliminate the "glitch" condition referred to herein above in connection with FIG. 2. For example, when all switch arms S8a-SNa switch from the solid line position S8a to the dotted line position $S8a^1$ and 22-7 and 23-7 were previously connected to lines 82 and 81 respectively, switches SB and SC reverse position connecting 22-7 to line 81 and connecting 23-7 to line 82 so that line 83 does not "see" the discontinuity due to switch occurring at a bit position (B7) which is a more significant bit position then bits B8-BN. This occurs, for example, when bits B8-BN are all at binary ONE and the error signal *e* is still greater than zero. Thus the counter 80 increments by one count changing all of the bits B8-BN to ZERO and changing bit B7 to ONE. Since the line 82 connecting 22-7 must change by the incremental value at stage B7 and since this change equals the accumulative incremental value of ladder resistors R1-RN then the outputs of 22-7 and 23-7 must be reversely coupled to lines 81 and 82 so that the complement of the output changes by twice the incremental value of stages R1-RN. The technique employed in FIG. 7 is described in detail in copending application (DDC-1) Ser. No. 723,112 filed Sept. 14, 1976, in which a single ladder network is utilized in a multiplexed fashion to thereby eliminate the need for two ladder networks conventionally employed in prior art converters.

Although the invention has been described with respect to its preferred embodiments, it should be understood that many variations and modifications will now be obvious to those who are skilled in the art and it is preferred therefore, that the scope of the invention be limited, not by the specific disclosure herein but by the appended claims.

I claim:

1. A resolver to digital type converter comprising function generator means having:

first and second chains, each of said chains, in turn, being comprised of at least four(4) operational amplifier stages, each having two inputs and an output;

the amplifiers of a first one of said chains being connected in cascade fashion with the output of each stage being connected to a first input of the next stage;

plural switch means each being associated with one stage of said second chain or amplifiers for selectively coupling each such stage to the prior adjacent amplifier stage of either said second chain or said first chain responsive to binary input control data;

the output of each amplifier stage of said second chain being summed at the first input of the next adjacent amplifier stage of said first chain together with the output of the amplifier of the same stage in said first chain;

each of said chains having an input for receiving a reference signal applied to the first amplifier and an output coupled to the last amplifier stage in the chain, whereby at least one of the outputs generates a signal which is a function of the reference inputs and the control inputs.

2. The generator means of claim 1 wherein the gain of each amplifier in said second chain is unity.

3. The generator means of claim 1 wherein the gain of each amplifier stage in said first chain is proportional less than the gain of the next preceeding amplifier in said first claim.

4. The generator means of claim 3 wherein for a sin/cosin function generator the gain of each amplifier stage is given by $K \sin(\theta - 90°/M)$ where K is a constant; $\theta$ is the angle being measured and N is the amplifier stage where M = 1, 2, ... N.

5. The generator of claim 1 wherein the outputs of said chains are coupled to switching means; a binary weighted resistance ladder network, said switching means coupling said outputs in a multiplexing fashion.

6. A synchro to digital type converter comprising function genrator means having:

first and second chains, each of said chains, in turn, being comprised of at least four operational amplifier stages, each having two inputs and an output;

the amplifiers of a first one of said chains being connected in cascade fashion with the output of each stage being connected to a first input of the next stage;

plural switch means each being associated with one stage of said second chain of amplifiers for selectively coupling each such stage to the prior adjacent amplifier stage of either said second chain or said first chain responsive to binary input control data;

the output of each amplifier stage of said second chain being summed at the first input of the next adjacent amplifier stage of said first chain together with the output of the amplifier of the same stage in said first chain;

each of said chains having an input for receiving a reference signal applied to the first amplifier stage and an output coupled to the last amplifier stage in the chain, whereby at least one of the outputs generates a signal which is a function of the reference inputs and the control inputs.

7. A resolver to digital converter wherein an analog input representative of an angle A has been converted into the conventional resolver analog signal forms sin A and cos A comprising:

first and second chains having input and respectively receiving said sin A and cos A signals, and each including an equal number of operational amplifier stages where the total number of stages at least is equal to or greater than 4;

the output of each amplifier in stage (*n*) of said first chain being coupled to one input of the amplifier of the next stage (*n*+1) in said chain;

a plurality of switch means for selectively coupling the input of each amplifier stage (*n*) in said second chain to the amplifier of the preceding stage (*n*−1) of either said first or said second chain;

the output of each amplifier stage (*n*) in the second chain being summed at the first input of the amplifier of the next succeeding stage in the first chain;

switch control means for receiving a digital word having plural bit positions wherein each bit position is assigned to one of said switches and the binary states of said bit positions each control the operating positions of an associated one of said switches;

the amplifiers in said first chain all having a first gain characteristic and all of the amplifiers in said second chain having a second gain characteristic which is different from said first gain characteristic to generate signals at the final stage of said first and second chains which are respectively given by the expressions sin $[\theta-(m+1)\phi]$ and sin $[\theta-m\phi]$ wherein $\phi = 360° \div$ the total number of stages $m$ of said first and second chains and where $m$ is also equal to number of bits in the binary digital word applied to the switch control means.

8. The converter of claim 7 comprising resistance means coupled between the output of each amplifier stage in said first chain and a second input of the amplifier for establishing the gain of the amplifier.

9. The apparatus of claim 8 wherein the gain of each amplifier stage in the first chain is less than unity.

10. The apparatus of claim 8 wherein the gain of each amplifier stage in the second chain is equal to unity.

11. The apparatus of claim 7 wherein the switching control means comprises gating means controlled by said binary control word for selectively coupling any amplifier stage in said first chain to any one of the prior stages in said first cain, to the exclusion of all other amplifier stages therebetween.

12. The apparatus of claim 11 wherein said gating means comprises exclusive-OR gates having an output for controlling the switching state of an associated switch means and having first and second inputs for receiving the binary bit of the binary word associated with said switch means and for receiving the binary bit associated with the switch means of the next preceding stage to prevent the switch means of any two adjacent stages from switching simultaneously to eliminate the occurrence of "glitches" in the output signal.

13. The apparatus of claim 7 further comprising a binarily weighted ladder resistor network and a second group of switch means for selectively coupling each resistor element in the network to one of the outputs of the final amplifier stages of said first and second chains for providing a converter of increased resolution.

* * * * *